US008994309B2

United States Patent
Lee

(10) Patent No.: US 8,994,309 B2
(45) Date of Patent: Mar. 31, 2015

(54) PULSE WIDTH MODULATION SIGNAL GENERATING CIRCUIT AND MOTOR DRIVING CIRCUIT

(71) Applicant: Samsung Electro-Mechanics Co., Ltd., Suwon, Gyunggi-do (KR)

(72) Inventor: Soo Woong Lee, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 251 days.

(21) Appl. No.: 13/746,685

(22) Filed: Jan. 22, 2013

(65) Prior Publication Data

US 2014/0117907 A1    May 1, 2014

(30) Foreign Application Priority Data

Nov. 1, 2012    (KR) .................. 10-2012-0123070

(51) Int. Cl.
| | |
|---|---|
| H02K 5/00 | (2006.01) |
| G05B 5/00 | (2006.01) |
| H02P 29/00 | (2006.01) |
| H03K 7/08 | (2006.01) |
| G05F 3/24 | (2006.01) |
| G05F 3/22 | (2006.01) |

(52) U.S. Cl.
CPC .......... *H02P 29/0088* (2013.01); *G05F 3/245* (2013.01); *G05F 3/225* (2013.01); *H03K 7/08* (2013.01)
USPC ..................... 318/471; 318/400.13

(58) Field of Classification Search
CPC .................. G05F 3/245; G05F 3/225
USPC .............. 318/400.13, 471
See application file for complete search history.

(56) References Cited

U.S. PATENT DOCUMENTS

| | | | | |
|---|---|---|---|---|
| 6,356,161 | B1 * | 3/2002 | Nolan et al. ................. | 331/176 |
| 7,714,674 | B2 * | 5/2010 | Guo et al. .................... | 331/176 |
| 8,030,985 | B2 | 10/2011 | Nagarajan et al. | |
| 8,521,035 | B2 * | 8/2013 | Knapp et al. ................ | 398/172 |
| 8,773,336 | B2 * | 7/2014 | Knapp .......................... | 345/82 |

(Continued)

FOREIGN PATENT DOCUMENTS

| | | |
|---|---|---|
| JP | 56-135963 A | 10/1981 |
| JP | 2005-106818 A | 4/2005 |

(Continued)

OTHER PUBLICATIONS

Notice of Office Action Korean Patent Application No. 10-2012-0123070 dated Oct. 2, 2013.

(Continued)

*Primary Examiner* — Erick Glass
(74) *Attorney, Agent, or Firm* — McDermott Will & Emery LLP

(57) ABSTRACT

There are provided a pulse width modulation (PWM) signal generating circuit and a motor driving circuit. The PWM signal generating circuit includes: a proportional-to-absolute temperature (PTAT) voltage generating unit generating a PTAT voltage in proportion to an absolute temperature; a reference wave signal generating unit generating a preset reference wave signal; and a PWM signal generating unit comparing the PTAT voltage and the reference wave signal with each other to generate a PWM signal, wherein the PTAT voltage generating unit adjusts the PTAT voltage according to a control signal.

14 Claims, 5 Drawing Sheets

(56) References Cited

U.S. PATENT DOCUMENTS

| | | | |
|---|---|---|---|
| 2003/0026154 A1 | 2/2003 | Kang et al. | |
| 2004/0247449 A1 | 12/2004 | Ma et al. | |
| 2005/0068214 A1 | 3/2005 | Kim | |
| 2009/0256623 A1* | 10/2009 | Tajima | 327/512 |
| 2013/0249419 A1* | 9/2013 | Zhang et al. | 315/186 |

FOREIGN PATENT DOCUMENTS

| | | |
|---|---|---|
| JP | 2010-164057 A | 7/2010 |
| KR | 2001-0040690 | 5/2001 |
| KR | 10-0404228 | 10/2003 |
| KR | 10-2008-0080696 A | 9/2008 |
| KR | 10-2009-0009019 A | 1/2009 |
| KR | 2012-0046393 A | 5/2012 |
| WO | 00/36745 | 6/2000 |

OTHER PUBLICATIONS

Office Action issued on Dec. 10, 2013 in the corresponding Japanese Patent Application No. 2013-007636.

* cited by examiner

PULSE WIDTH MODULATION SIGNAL GENERATING CIRCUIT AND MOTOR DRIVING CIRCUIT

CROSS-REFERENCE TO RELATED APPLICATIONS

This application claims the priority of Korean Patent Application No. 10-2012-0123070 filed on Nov. 1, 2012, in the Korean Intellectual Property Office, the disclosure of which is incorporated herein by reference.

BACKGROUND OF THE INVENTION

1. Field of the Invention

The present invention relates to a pulse width modulation (PWM) signal generating circuit and a motor driving circuit, capable of being applied to a fan motor and adjusting a proportional-to-absolute temperature (PTAT) voltage used to generate a PWM signal.

2. Description of the Related Art

Generally, in order to drive a fan motor, a motor driving circuit includes a pulse width modulation (PWM) signal generating unit generating a PWM signal and a driving unit generating a driving signal using the PWM signal.

Here, the PWM driving unit adjusts a duty ratio of the PWM signal according to a degree of heat radiation of a motor driving circuit to decrease an influence thereon due to the heat radiation.

Meanwhile, a motor driving circuit according to the related art includes a temperature sensor in order to compensate for an influence thereon due to a temperature change in the motor driving circuit.

The temperature sensor may detect the temperature change in the motor driving circuit. However, it may be difficult to integrate the temperature sensor with the motor driving circuit for miniaturization in the motor driving circuit.

In addition, an output value according to a temperature range that may be detected by the temperature sensor is fixed, such that it may not be appropriately adjusted according to a state of a product to which the temperature sensor is applied.

The following Related Art Document (Patent Document 1), which relates to a temperature compensation type oscillator, may provide a proportional-to-absolute temperature (PTAT) voltage simply using a transistor, but does not disclose a technical feature of adjusting the PTAT voltage using a control signal.

RELATED ART DOCUMENT (Patent Document 1) Korean Patent Laid-Open Publication No. 10-2012-0046393

SUMMARY OF THE INVENTION

An aspect of the present invention provides a pulse width modulation (PWM) signal generating circuit and a motor driving circuit capable of being applied to a fan motor and adjusting a proportional-to-absolute temperature (PTAT) voltage used to generate a PWM signal.

According to an aspect of the present invention, there is provided a pulse width modulation (PWM) signal generating circuit, including: a proportional-to-absolute temperature (PTAT) voltage generating unit generating a PTAT voltage in proportion to an absolute temperature; a reference wave signal generating unit generating a preset reference wave signal; and a PWM signal generating unit comparing the PTAT voltage and the reference wave signal with each other to generate a PWM signal, wherein the PTAT voltage generating unit adjusts the PTAT voltage according to a control signal.

According to another aspect of the present invention, there is provided a motor driving circuit, including: a PTAT voltage generating unit generating a PTAT voltage in proportion to an absolute temperature; a reference wave signal generating unit generating a preset reference wave signal; a PWM signal generating unit comparing the PTAT voltage and the reference wave signal with each other to generate a PWM signal; and a motor driving unit generating a gate signal for driving a motor using the PWM signal, wherein the PTAT voltage generating unit adjusts the PTAT voltage according to a control signal.

The PTAT voltage generating unit may adjust the PTAT voltage according to a ratio between variable resistance varied according to the control signal and PTAT resistance in proportion to the absolute temperature.

The PTAT voltage generating unit may include: a resistor circuit part including first to n-th resistors having one ends thereof connected to a power supply voltage terminal in parallel and the other ends thereof; a switch circuit part including first to n-th switches having one ends thereof connected to the respective other ends of the first to n-th resistors and the other ends thereof, each of the first and n-th switches being switched according to the control signal; and a semiconductor element installed between a common connection node connected to the respective other ends of the first to n-th switches and a ground, and having the PTAT resistance.

The PTAT voltage generating unit may include: v a semiconductor element having one end thereof connected to a power supply voltage terminal and the other end thereof, and having the PTAT resistance; a switch circuit part including first to n-th switches having one ends thereof connected to the other end of the semiconductor element in parallel and the other ends thereof, each of the first and n-th switches being switched according to the control signal; and a resistor circuit part including first to n-th resistors having one ends thereof connected to the respective other ends of the first to n-th switches and the other ends thereof connected to the ground.

The semiconductor element may include a transistor having the PTAT resistance.

The PWM signal generating unit may provide the PWM signal having a high level when a voltage level of the reference wave signal is equal to or higher than a level of the PTAT voltage and provide the PWM signal having a low level when the voltage level of the reference wave signal is lower than the level of the PTAT voltage.

The PWM signal generating unit may provide the PWM signal having a low level when a voltage level of the reference wave signal is equal to or higher than a level of the PTAT voltage and provide the PWM signal having a high level when the voltage level of the reference wave signal is lower than the level of the PTAT voltage.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
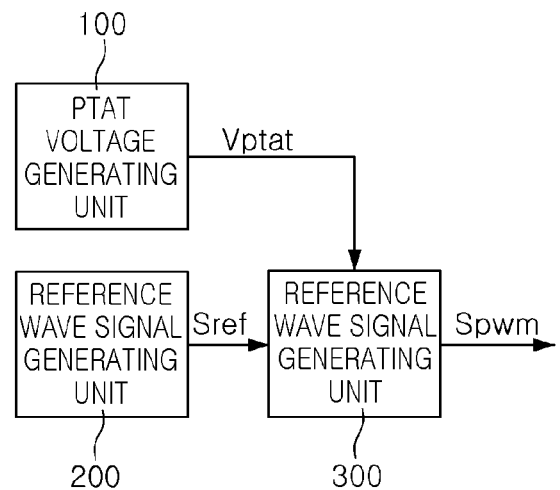
FIG. 1 is a block diagram illustrating a pulse width modulation (PWM) signal generating circuit according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

FIG. 1 is a block diagram illustrating a pulse width modulation (PWM) signal generating circuit according to an embodiment of the present invention.

Referring to FIG. 1, the PWM signal generating circuit according to the embodiment of the present invention may include a proportional-to-absolute temperature (PTAT) voltage generating unit 100, a reference wave signal generating unit 200, and a PWM signal generating unit 300.

Figure 2:
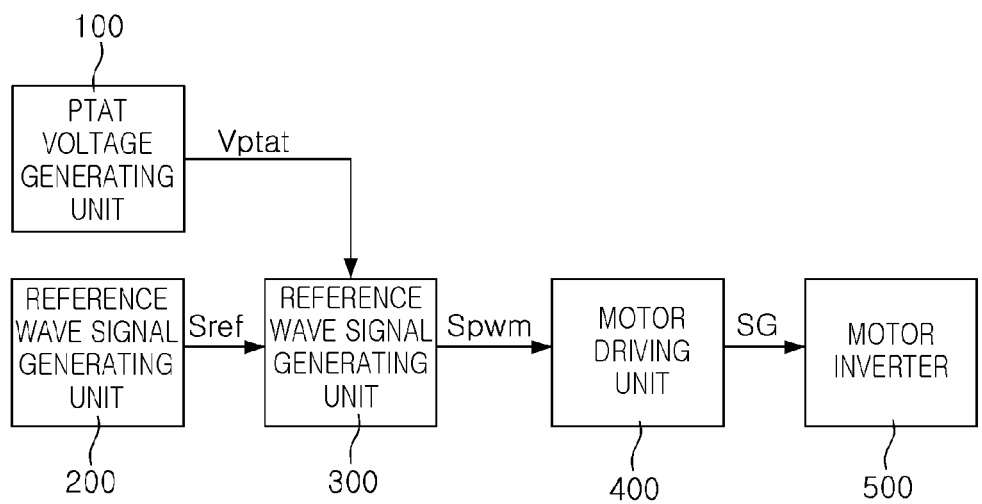
FIG. 2 is a block diagram illustrating a motor driving circuit according to the embodiment of the present invention.

FIG. 2 is a block diagram illustrating a motor driving circuit according to the embodiment of the present invention.

Referring to FIG. 2, the motor driving circuit according to the embodiment of the present invention may include the PTAT voltage generating unit 100, the reference wave signal generating unit 200, the PWM signal generating unit 300, and a motor driving unit 400.

The PTAT voltage generating unit 100 may generate a PTAT voltage Vptat in proportion to an absolute temperature. In addition, the PTAT voltage generating unit 100 may adjust the PTAT voltage Vptat according to a control signal SC.

The reference wave signal generating unit 200 may generate a preset reference wave signal Sref. Here, the reference wave signal Sref may be a triangular wave or saw wave signal having a preset frequency.

In addition, the PWM signal generating unit 300 may compare the PTAT voltage Vptat and the reference wave signal Sref to generate a PWM signal. Here, the PWM signal may have the same frequency as the reference wave signal and be a signal in which a high level and a low level are repeated. A width of the PWM signal may be varied according to a comparison result between the PTAT voltage Vptat and the reference wave signal Sref.

The motor driving unit 400 may generate a gate signal SG for driving a motor using the PWM signal and provide the gate signal SG to a motor inverter 500 to thereby drive the motor.

More specifically, the PTAT voltage generating unit 100 may adjust the PTAT voltage Vptat according to a ratio between variable resistance varied according to the control signal SC and PTAT resistance in proportion to an absolute temperature.

Examples of the PTAT voltage generating unit 100 as described above will be described with reference to FIGS. 3 and 4.

Figure 3:
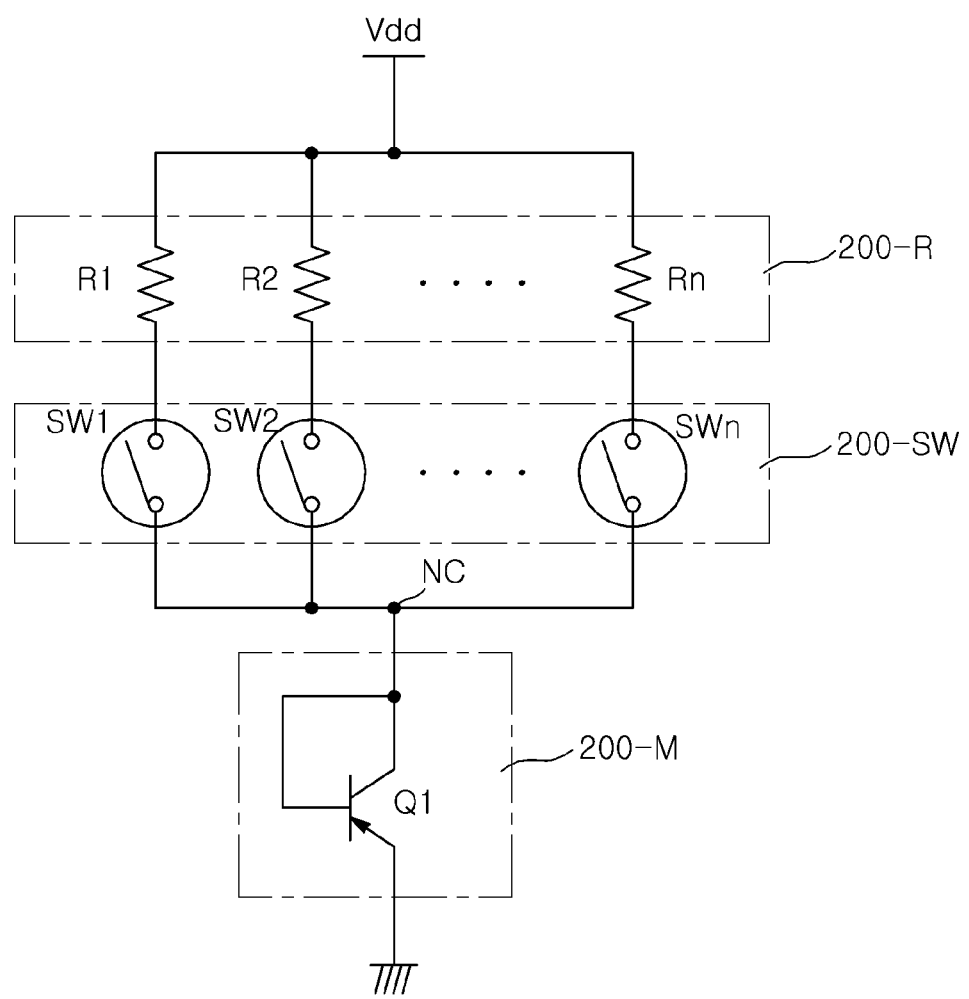
FIG. 3 is a circuit diagram illustrating an example of a proportional-to-absolute temperature (PTAT) voltage generating unit according to the embodiment of the present invention.

FIG. 3 is a circuit diagram illustrating an example of a proportional-to-absolute temperature (PTAT) voltage generating unit according to the embodiment of the present invention.

Referring to FIG. 3, the PTAT voltage generating unit 100 may include a resistor circuit part 200-R, a switch circuit part 200-SW, and a semiconductor element 200-M.

Referring to FIG. 3, the resistor circuit part 200-R may include first to n-th resistors R1 to Rn (n indicates a natural number of 2 or greater) having one ends thereof connected to a power supply voltage terminal Vdd in parallel and other ends thereof. Here, the resistor circuit part 200-R may include at least two resistors in order to vary resistance.

The switch circuit part 200-SW may include first to n-th switches SW1 to SWn having one ends thereof connected to the respective other ends of the first to n-th resistors R1 to Rn and the other ends thereof. Here, each of the first and n-th switches SW1 to SWn may be switched according to the control signal SC.

For example, in the case in which the switch circuit part 200-SW includes first to eighth switches, only the first switch may be turned on while the second to eighth switches may be turned off; only the second switch may be turned on while the first switch and the third to eighth switches may be turned off; or only the eighth switch may be turned on while the first to seventh switches may be turned off.

Here, the first to n-th switches SW1 to SWn, which are semiconductor switch elements, may be formed of a metal oxide semiconductor field effect transistor (MOSFET) as an example.

In addition, the semiconductor element 200-M may be installed between a common connection node NC connected to the other ends of the first to n-th switches SW1 to SWn and a ground, and have the PTAT resistance.

For example, the semiconductor element 200-M may be formed of a transistor having a collector and a base connected to the common connection node NC, and an emitter connected to the ground. The transistor as described above may provide the PTAT resistance in proportion to the absolute temperature.

Figure 4:
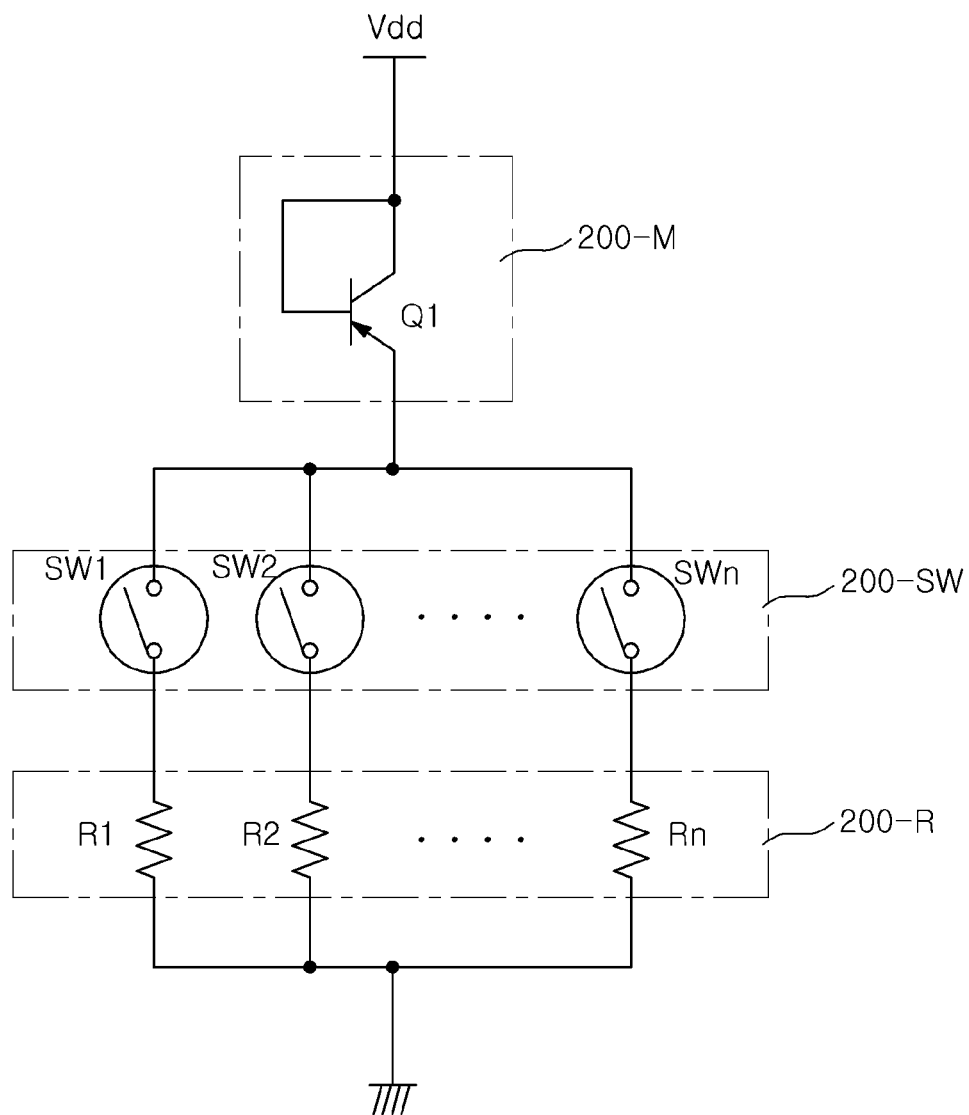
FIG. 4 is a circuit diagram illustrating another example of a PTAT voltage generating unit according to the embodiment of the present invention.

FIG. 4 is a circuit diagram illustrating another example of a PTAT voltage generating unit according to the embodiment of the present invention.

Referring to FIG. 4, the PTAT voltage generating unit 100 may include the semiconductor element 200-M, the switch circuit part 200-SW, and the resistor circuit part 200-R.

Referring to FIG. 4, the semiconductor element 200-M may have one end thereof connected to the power supply voltage terminal Vdd and the other end thereof and have the PTAT resistance.

The semiconductor element 200-M may include a transistor Q1 having the PTAT resistance.

The switch circuit part 200-SW may include the first to n-th switches SW1 to SWn (n indicates a natural number of 2 or greater) having one ends thereof connected to the other end of the semiconductor element 200-M in parallel and the other ends thereof.

Each of the first and n-th switches SW1 to SWn may be switched according to the control signal SC.

The resistor circuit part 200-R may include the first to n-th resistors R1 to Rn having one ends thereof connected to the respective other ends of the first to n-th switches SW1 to SWn and the other ends thereof connected to a ground.

Figure 5:
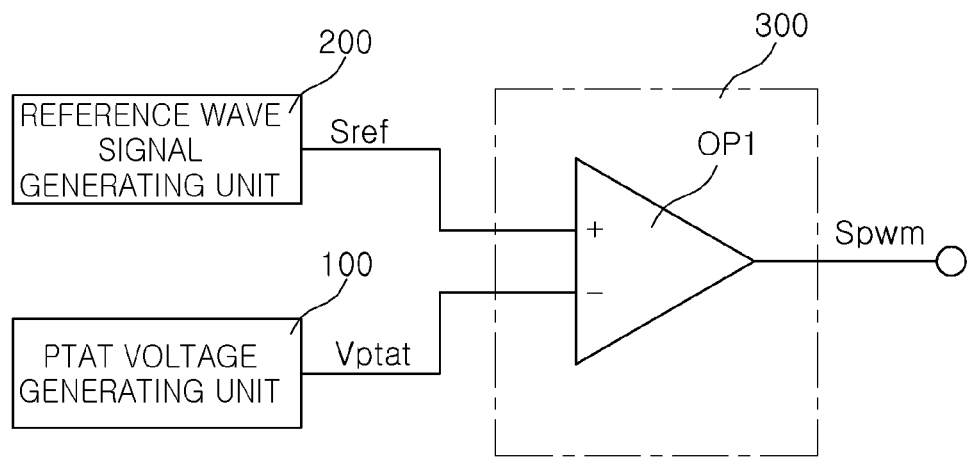
FIG. 5 is a circuit diagram illustrating an example of a PWM. signal generating unit according to the embodiment of the present invention.

FIG. 5 is a circuit diagram illustrating an example of a PWM. signal generating unit according to the embodiment of the present invention.

Referring to FIG. 5, the PWM signal generating unit 300 may include a first operational amplifier OP1 having a non-inverting input terminal receiving the reference wave signal Sref, an inverting input terminal receiving the PTAT voltage Vptat, and an output terminal.

The first operational amplifier OP1 may provide a PWM signal Spwm having a high level when a voltage level of the reference wave signal Sref is equal to or higher than a level of the PTAT voltage Vptat and provide the PWM signal Spwm having a low level when the voltage level of the reference wave signal Sref is lower than the level of the PTAT voltage Vptat.

Figure 6:
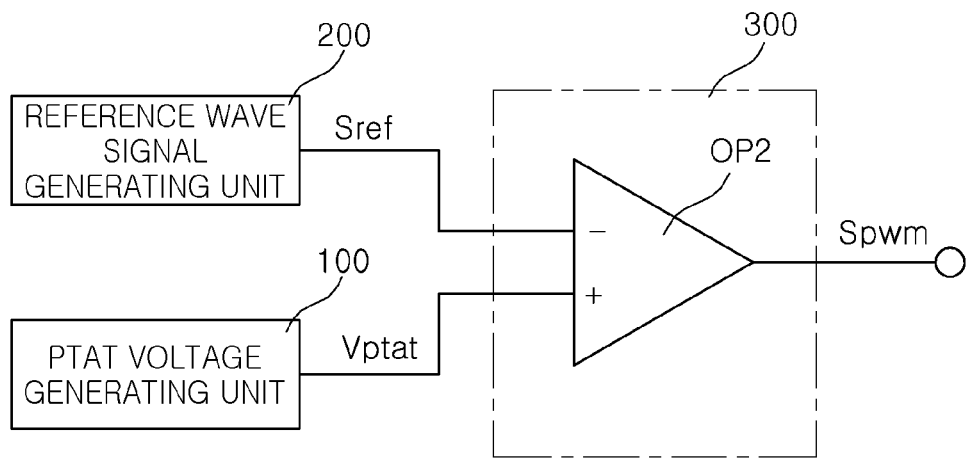
FIG. 6 is a circuit diagram illustrating another example of a PWM signal generating unit according to the embodiment of the present invention.

FIG. 6 is a circuit diagram illustrating another example of a PWM signal generating unit according to the embodiment of the present invention.

Referring to FIG. 6, the PWM signal generating unit 300 may include a second operational amplifier OP2 having an inverting input terminal receiving the reference wave signal Sref, a non-inverting input terminal receiving the PTAT voltage Vptat, and an output terminal.

The second operational amplifier OP2 may provide the PWM signal Spwm having a low level when a voltage level of the reference wave signal Sref is equal to or higher than a level of the PTAT voltage Vptat and provide the PWM signal Spwm having a high level when the voltage level of the reference wave signal Sref is lower than the level of the PTAT voltage Vptat.

Figure 7:
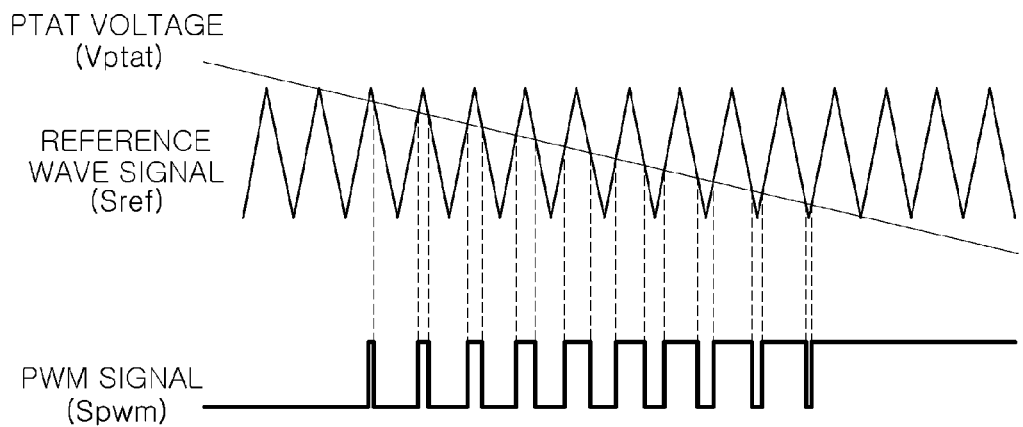
FIG. 7 is a diagram illustrating a principle of generating a PWM signal according to the embodiment of the present invention.

FIG. 7 is a diagram illustrating a principle of generating a PWM signal according to the embodiment of the present invention.

Referring to FIGS. 5 and 7, the PWM signal generated in the PWM signal generating unit 300 shown in FIG. 5 may be generated according to the principle as shown in FIG. 7.

For example, for convenience of explanation, in the case in which the PTAT voltage Vptat is gradually decreased, the PWM signal may have the high level when the voltage level of the reference wave signal Sref is equal to or higher than the level of the PTAT voltage Vptat and have the low level when the voltage level of the reference wave signal Sref is lower than the level of the PTAT voltage Vptat.

Figure 8:
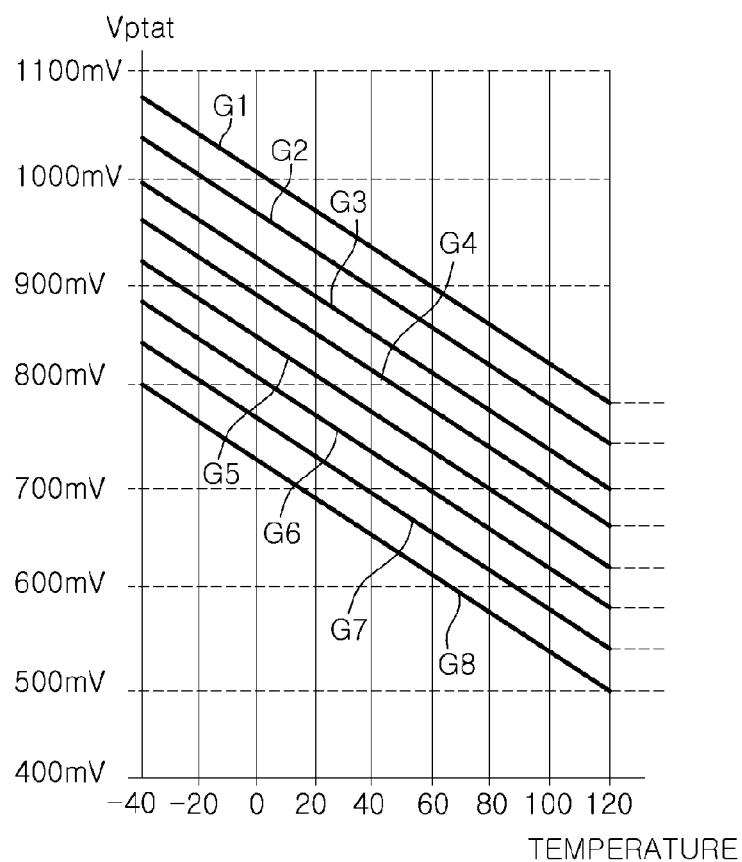
FIG. 8 is a diagram showing graphs respectively illustrating a relationship between a PTAT voltage and a temperature according to the embodiment of the present invention.

FIG. 8 is a graph illustrating a relationship between a PTAT voltage and a temperature according to the embodiment of the present invention.

Referring to FIG. 8, graphs respectively illustrating a relationship between an absolute temperature and a PTAT voltage Vptat in the case in which the resistor circuit part 200-R shown in FIG. 3 includes first to eighth resistors and the switch circuit part 200-SW also includes first to eighth switches are shown.

G1 is a graph illustrating a relationship between the absolute temperature and the PTAT voltage Vptat in the case in which only the first switch is turned on, such that only the first resistor is selected. G2 is a graph illustrating a relationship between the absolute temperature and the PTAT voltage Vptat in the case in which only the second switch is turned on, such that only the second resistor is selected. G3 is a graph illustrating a relationship between the absolute temperature and the PTAT voltage Vptat in the case in which only the third switch is turned on, such that only the third resistor is selected. G4 is a graph illustrating a relationship between the absolute temperature and the PTAT voltage Vptat in the case in which only the fourth switch is turned on, such that only the fourth resistor is selected. G5 is a graph illustrating a relationship between the absolute temperature and the PTAT voltage Vptat in the case in which only the fifth switch is turned on, such that only the fifth resistor is selected. G6 is a graph illustrating a relationship between the absolute temperature and the PTAT voltage Vptat in the case in which only the sixth switch is turned on, such that only the sixth resistor is selected. G7 is a graph illustrating a relationship between the absolute temperature and the PTAT voltage Vptat in the case in which only the seventh switch is turned on, such that only the seventh resistor is selected. In addition, G8 is a graph illustrating a relationship between the absolute temperature and the PTAT voltage Vptat in the case in which only the eighth switch is turned on, such that only the eighth resistor is selected.

Referring to the graphs G1 to G8 shown in FIG. 8, it may be appreciated that the PTAT voltage Vptat corresponding to the absolute temperature may be adjusted by selecting the resistors of the resistor circuit part 200-R through the switch circuit part 200-SW.

The description shown in FIG. 8 as described above is only an example illustrating a single operation feature according to the embodiment of the present invention. Therefore, various features between the absolute temperature and the PTAT voltage Vptat may be implemented according to a combination of turn-on and turn-off switching of the plurality of switches included in the switch circuit part 200-SW.

As set forth above, according to the embodiments of the present invention, the PTAT voltage generating circuit generating the PTAT voltage used to generate the PWM signal and in proportion to the absolute temperature can be implemented as an integrated circuit, and the PTAT voltage can be adjusted according to a product to which the PTAT voltage generating circuit is applied.

While the present invention has been shown and described in connection with the embodiments, it will be apparent to those skilled in the art that modifications and variations can be made without departing from the spirit and scope of the invention as defined by the appended claims.

What is claimed is:

1. A pulse width modulation (PWM) signal generating circuit comprising:
    a proportional-to-absolute temperature (PTAT) voltage generating unit generating a PTAT voltage in proportion to an absolute temperature;
    a reference wave signal generating unit generating a preset reference wave signal; and
    a PWM signal generating unit comparing the PTAT voltage and the reference wave signal with each other to generate a PWM signal,
    wherein the PTAT voltage generating unit adjusts the PTAT voltage according to a control signal.

2. The PWM signal generating circuit of claim 1, wherein the PTAT voltage generating unit adjusts the PTAT voltage according to a ratio between variable resistance varied according to the control signal and PTAT resistance in proportion to the absolute temperature.

3. The PWM signal generating circuit of claim 2, wherein the PTAT voltage generating unit includes:

a resistor circuit part including first to n-th resistors having one ends thereof connected to a power supply voltage terminal in parallel and the other ends thereof;

a switch circuit part including first to n-th switches having one ends thereof connected to the respective other ends of the first to n-th resistors and the other ends thereof, each of the first and n-th switches being switched according to the control signal; and a semiconductor element installed between a common connection node connected to the respective other ends of the first to n-th switches and a ground, and having the PTAT resistance.

4. The PWM. signal generating circuit of claim. 2, wherein the PTAT voltage generating unit includes:

a semiconductor element having one end thereof connected to a power supply voltage terminal and the other end thereof, and having the PTAT resistance;

a switch circuit part including first to n-th switches having one ends thereof connected to the other end of the semiconductor element in parallel and the other ends thereof, each of the first and n-th switches being switched according to the control signal; and a resistor circuit part including first to n-th resistors having one ends thereof connected to the respective other ends of the first to n-th switches and the other ends thereof connected to the ground.

5. The PWM signal generating circuit of claim 4, wherein the semiconductor element includes a transistor having the PTAT resistance.

6. The PWM signal generating circuit of claim 1, wherein the PWM signal generating unit provides the PWM signal having a high level when a voltage level of the reference wave signal is equal to or higher than a level of the PTAT voltage and provides the PWM signal having a low level when the voltage level of the reference wave signal is lower than the level of the PTAT voltage.

7. The PWM signal generating circuit of claim 1, wherein the PWM signal generating unit provides the PWM signal having a low level when a voltage level of the reference wave signal is equal to or higher than a level of the PTAT voltage and provides the PWM signal having a high level when the voltage level of the reference wave signal is lower than the level of the PTAT voltage.

8. A motor driving circuit comprising:

a PTAT voltage generating unit generating a PTAT voltage in proportion to an absolute temperature;

a reference wave signal generating unit generating a preset reference wave signal;

a PWM signal generating unit comparing the PTAT voltage and the reference wave signal with each other to generate a PWM signal; and a motor driving unit generating a gate signal for driving a motor using the PWM signal, wherein the PTAT voltage generating unit adjusts the PTAT voltage according to a control signal.

9. The motor driving circuit of claim 8, wherein the PTAT voltage generating unit adjusts the PTAT voltage according to a ratio between variable resistance varied according to the control signal and PTAT resistance in proportion to the absolute temperature.

10. The motor driving circuit of claim 9, wherein the PTAT voltage generating unit includes:

a resistor circuit part including first to n-th resistors having one ends thereof connected to a power supply voltage terminal in parallel and the other ends thereof;

a switch circuit part including first to n-th switches having one ends thereof connected to the respective other ends of the first to n-th resistors and the other ends thereof, each of the first and n-th switches being switched according to the control signal; and a semiconductor element installed between a common connection node connected to the respective other ends of the first to n-th switches and a ground, and having the PTAT resistance.

11. The motor driving circuit of claim 9, wherein the PTAT voltage generating unit includes:

a semiconductor element having one end thereof connected to a power supply voltage terminal and the other end thereof, and having the PTAT resistance;

a switch circuit part including first to n-th switches having one ends thereof connected to the other end of the semiconductor element in parallel and the other ends thereof, each of the first and n-th switches being switched according to the control signal; and a resistor circuit part including first to n-th resistors having one ends thereof connected to the respective other ends of the first to n-th switches and the other ends thereof connected to the ground.

12. The motor driving circuit of claim 11, wherein the semiconductor element includes a transistor having the PTAT resistance.

13. The motor driving circuit of claim 8, wherein the PWM signal generating unit provides the PWM signal having a high level when a voltage level of the reference wave signal is equal to or higher than a level of the PTAT voltage and provides the PWM signal having a low level when the voltage level of the reference wave signal is lower than the level of the PTAT voltage.

14. The motor driving circuit of claim 8, wherein the PWM signal generating unit provides the PWM signal having a low level when a voltage level of the reference wave signal is equal to or higher than a level of the PTAT voltage and provides the PWM signal having a high level when the voltage level of the reference wave signal is lower than the level of the PTAT voltage.

* * * * *